(12) United States Patent
Morell et al.

(10) Patent No.: US 8,491,964 B1
(45) Date of Patent: Jul. 23, 2013

(54) DIAMOND NUCLEATION USING POLYETHENE

(75) Inventors: Gerardo Morell, Guaynabo, PR (US);
Vladimir Makarov, San Juan, PR (US);
Deepak Varshney, San Juan, PR (US);
Brad Weiner, Dorado, PR (US)

(73) Assignee: University of Puerto Rico, San Juan, PR (US)

( * ) Notice: Subject to any disclaimer, the term of this patent is extended or adjusted under 35 U.S.C. 154(b) by 74 days.

(21) Appl. No.: 13/070,214

(22) Filed: Mar. 23, 2011

Related U.S. Application Data

(60) Provisional application No. 61/316,900, filed on Mar. 24, 2010.

(51) Int. Cl.
*C23C 16/27* (2006.01)

(52) U.S. Cl.
USPC ............... 427/249.8; 427/248.1; 427/249.1

(58) Field of Classification Search
None
See application file for complete search history.

(56) References Cited

U.S. PATENT DOCUMENTS 5,614,258 A * 3/1997 Moskovits et al. ...... 427/249.12

OTHER PUBLICATIONS

Varshney, Diamond Nucleation Poster—presented at Symposium J MRS Fall meeting 2009, presentation J17.4 presented Dec. 3, 2009.*
Jingsheng, Thin Solid Films, V346, 1999, p. 120-4.*

* cited by examiner

*Primary Examiner* — Joseph Miller, Jr.
(74) *Attorney, Agent, or Firm* — Hoglund & Pamias, PSC; Roberto J Rios

(57) ABSTRACT

The invention presents a simple, non-destructive and non-abrasive method of diamond nucleation using polyethene. It particularly describes the nucleation of diamond on an electrically viable substrate surface using polyethene via chemical vapor deposition (CVD) technique in a gaseous environment.

13 Claims, 7 Drawing Sheets

DIAMOND NUCLEATION USING POLYETHENE

GOVERNMENT INTEREST

The claimed invention was made with U.S. Government support under grant number NNX07AO30A awarded by the National Aeronautics and Space Administration (NASA) and grant number DE-FG02-08ER46526 awarded by the Department of Energy (DOE). The government has certain rights in this invention.

BACKGROUND OF THE INVENTION

The combined properties of good electrical insulation, high thermal conductivity, and low dielectric constant make diamond well suited for use in electronic device packaging and multichip module technologies. The deposition of micro, nano and ultrananocrystalline diamond has been reported on various kinds of substrates. The substrates can be classified into three groups viz. ones that form carbides (Si, Mo, W); those which dissolve carbon but do not form carbides (Pt, Pd, Rh); and those which neither dissolve carbon nor form carbides (Cu, Ag, Au). Diamond films on Cu substrates or Cu surfaces are of significant interest with respect to present-day electronics (copper interconnects) and microelectronics. The growth of well-adhered and dense diamond films on non-carbide forming and non-carbon dissolving substrates or surfaces like Cu Ag, Au is important in view of electrical applications but it is usually considered impractical because of poor adhesion, low nucleation density, and their immiscibility with carbon.

Diamond nucleation on non-diamond surfaces without pre-treatment is usually very difficult and slow. Various methods are employed in the existing art to improve the nucleation density. Diamond nucleation on non-diamond surfaces can be enhanced by the surface pretreatments including scratching, seeding, electrical biasing, ion implantation, ultrasonic abrasion with diamond powder mixture suspensions and pre-coating silicon substrate nucleation layers such as tungsten followed by ultrasonic agitation with nanodiamond powder.

It is a well established fact known to those skilled in the art that the nucleation density is enhanced by various pre-treatment methods but at the same time, the surface alteration or damage (usually by the formation of nano-scale pits and scratches and defect concentration) and contamination of the substrate surface in varying degrees as a result of any kind of pre-treatment cannot be overruled and is inevitable. Also, these pretreatment methods cannot be easily applied to substrates of complex geometry and shape, and are incompatible with many real-life applications requiring such diamond films viz. electronic devices, and optical window materials and they even add to the expenditure. Thus, pre-treatment of the substrate surface to enhance nucleation density renders it unsuitable for integration into electronics line of production.

Hence, there exists the need of an effective method of diamond nucleation on an electrically viable surface that does not require any pre-treatment and exhibits high nucleation density. The present invention overcomes the drawbacks of the pre-treatment methods and leads to the direct integration of diamond in electronic chips and also reduces the production cost.

SUMMARY OF THE INVENTION

The present invention is directed to a method of diamond nucleation that utilizes a cheap seeding material in the form of polyethene for the diamond film deposition on a substrate surface that neither forms carbide nor dissolves carbon and is electrically viable.

The present invention overcomes the drawbacks of the seeding methods known in the art and uses polyethene as nucleating agent to deposit diamond on a non-carbide forming and non-carbon dissolving, electrically viable substrate surface. The method of the present invention allows covering of large substrate surfaces cheaply and completely and reduces the production cost to a point at which it becomes economically viable to use diamond as a material of choice.

According to an aspect of the invention, a novel method of diamond nucleation using polyethene followed by chemical vapor diamond deposition is presented.

According to another aspect of the invention, a non-abrasive, non-destructive method of diamond nucleation comprises: providing a substrate surface, depositing polyethene layer on the substrate surface, and exposing the substrate surface to a gaseous mixture.

According to still another aspect of the invention, the gaseous mixture comprises at least a carbon-containing gas and hydrogen at a substrate temperature of 400-800° C. in presence of an energy source that can break the gaseous molecules into radicals.

According to another aspect of the invention, the substrate surface is a metal that neither forms carbide nor dissolves carbon.

According to a further aspect of the invention, the substrate surface is selected from a group of metals that neither form carbide nor dissolve carbon, such as but not limited to Cu, Ag, and Au. These substrate surfaces usually give poor nucleation density without using any conventional seeding method but surprisingly, the method of the present invention, results in a well-adhered diamond film with a high nucleation density, without exposing the substrate surface to any mechanical damage.

According to one aspect of the invention, a non-destructive, non-abrasive, scalable and economic process of diamond nucleation is provided.

According to another aspect of the invention, the polyethene comprises at least one of low density polyethene (LDPE), medium density polyethene (MDPE), high density polyethene (HDPE), linear low density polyethene (LLDPE) and very low density polyethene (VLDPE).

In yet another aspect of the invention, polyethene has a density between 0.80-0.95 $g/cm^3$.

According to another aspect of the invention, the carbon-containing gas comprises at least one of hydrocarbons, hydrocarbons containing oxygen and/or nitrogen, hydrocarbons containing halogens, carbon vapor, CO and $CO_2$.

According to one aspect of the invention, polyethene can be deposited on the substrate surface by techniques such as but not limited to melting, sputtering, spin coating, dipping, and dip pen lithography. Any technique that can result in a polyethene layer on the substrate surface can be used in conformation with the process of the present invention.

According to another aspect of the invention, the polyethene layer is at least 100 nm thick.

According to still another aspect of the invention, the ratio of the carbon-containing gas and hydrogen is about 0.1-3.0:100.

According to one aspect of the invention, the ratio of the carbon containing gas and hydrogen is about 0.3-1.0:100.

According to still another aspect of the invention, a sulfur containing species in the concentration range of about 100 ppm to about 1000 ppm is added to the gaseous mixture for enhancing the density of diamond nucleation and growth rate.

According to another aspect of the invention, the total pressure of the gases in the gaseous mixture is in the range of about 10-100 Torr.

According to a further aspect of the invention, a method of diamond nucleation is provided, wherein the polyethene is a 'kitchen-wrap' or 'food-wrap' polyethene. The 'kitchen wrap' or 'food-wrap' polyethene is a simple and cheap seeding material for diamond nucleation as compared to any conventionally used seeding process.

According to another aspect of the invention, the method of diamond thin film nucleation is made on a copper substrate by 'food-wrap' polyethene under chemical vapor deposition conditions.

According to still another aspect of the invention, the method of nucleation of diamond film is made on a silver substrate by 'food-wrap' polyethene under chemical vapor deposition conditions.

According to one aspect of the invention, a method of fabrication of diamond using polyethene as nucleating agent is provided, said method comprising: providing a substrate surface, depositing polyethene layer on the substrate surface, and exposing the substrate surface to a gaseous mixture comprising of at least a carbon-containing gas, and hydrogen at a substrate temperature of 400-800° C. for a period of at least 0.5 hours, in presence of an energy source that can break the gaseous molecules into radical; wherein the said substrate surface is a metal that neither forms carbide nor dissolves carbon.

According to another aspect of the invention, a method of fabrication of diamond using polyethene as nucleating agent is provided wherein, the substrate surface comprises at least one of Cu, Ag, and Au.

According to a further aspect of the invention, the carbon-containing gas comprises at least one of hydrocarbons, hydrocarbons containing oxygen and/or nitrogen, hydrocarbons containing halogens, carbon vapor, CO and CO2.

According to still another aspect of the invention, a method of diamond nucleation using polyethene is provided that is a significant step towards non-cumbersome, non-abrasive and non-destructive nucleation of diamond for commercial production particularly in the field of electronics. Surprisingly, even the presence of any catalyst or seeding that have been conventionally used in the state of the art is not required.

Hereinafter, the present invention will be explained in more detail with reference to the following description and accompanying drawings. However, the examples provided are given for the purpose of illustration of one of the various embodiments of the present invention and in no way be construed as limiting the scope of the invention.

BRIEF DESCRIPTION OF THE INVENTION

Further features and advantages of the invention will become apparent from the following detailed description taken in conjunction with the accompanying figures showing illustrative embodiments of the invention, in which.

Throughout the figures, the same reference numbers and characters, unless otherwise stated, are used to denote like elements, components, portions or features of the illustrated embodiments. The subject invention will be described in detail in conjunction with the accompanying figures, in view of the illustrative embodiments.

DETAILED DESCRIPTION OF THE INVENTION

I. Nucleation and Fabrication of Diamond on Copper Substrate

A polyethene layer of thickness 90 μm was melted on a copper substrate at a temperature of 120° C. The substrate was cleaned in isopropanol before introducing it into the HFCVD chamber. The gas mixture consisted of 0.3% methane in hydrogen at a constant pressure of 20 Torr and a total gas flow of 100 sccm. The gas mixture was activated by a filament of rhenium wire of 8 cm length and 0.5 mm diameter and positioned at 9 mm above the heated Mo disks (25 mm diameter) that were used as substrate holders. The substrate temperature was kept ~500° C. and the filament temperature was kept ~2500° C. The reaction was carried out for a period of 8 hours.

Figure 1A:
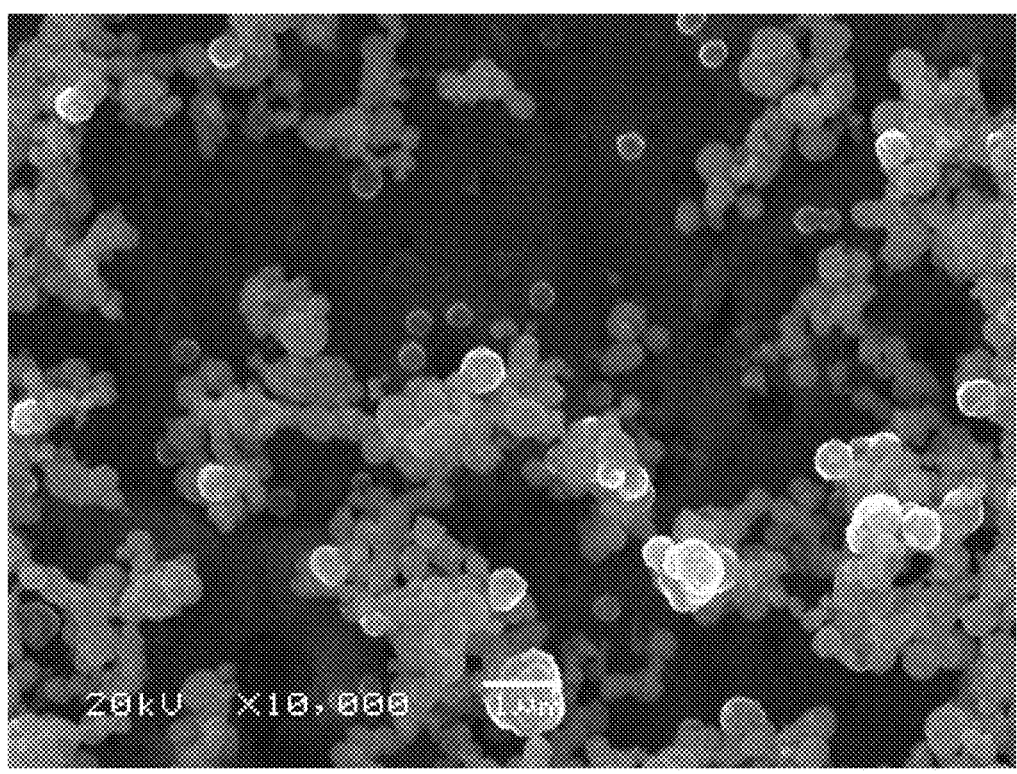
FIG. 1a shows an SEM image of microphase transition of food wrap polyethene to diamond on the Cu substrate, wherein the formation of sub-nanocrystallite nucleation centers after 1-3 hours, according to an embodiment of the invention.
Figure 1B:
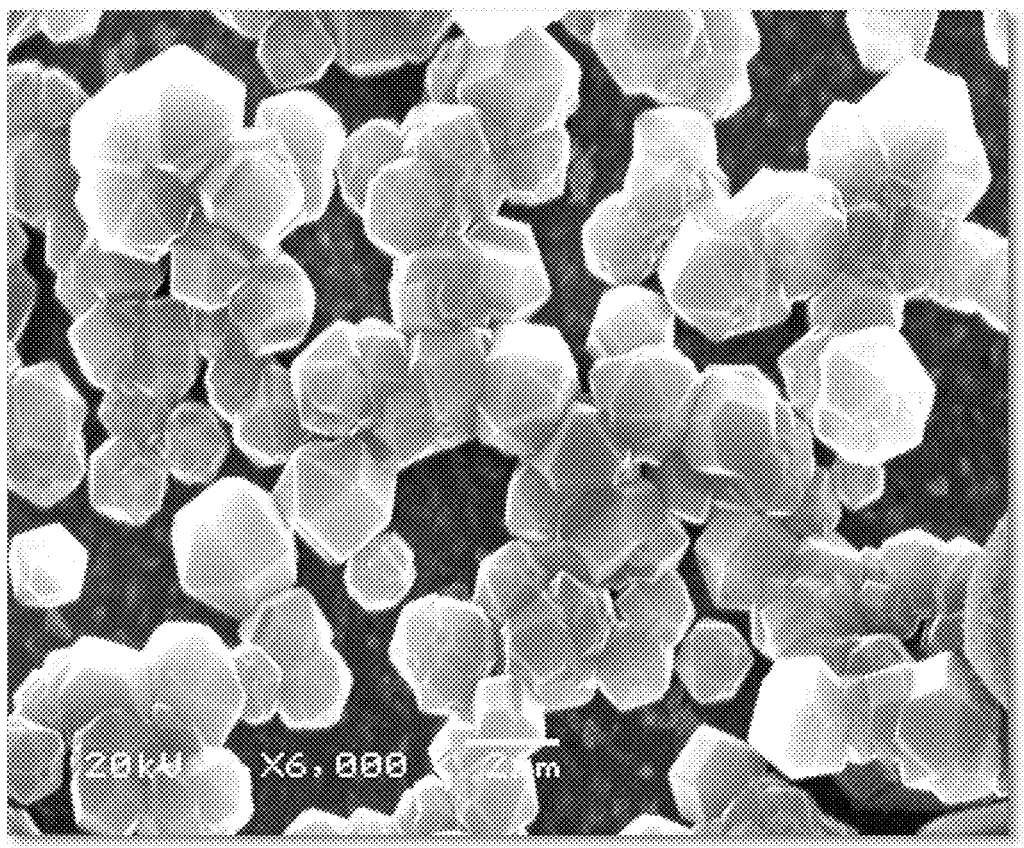
FIGS. 1b and 1c show SEM images of microphase transition of food wrap polyethene to diamond on the Cu substrate, wherein the formation of microcrystalline diamond after 3-6 hours, according to an embodiment of the invention.
Figure 1C:
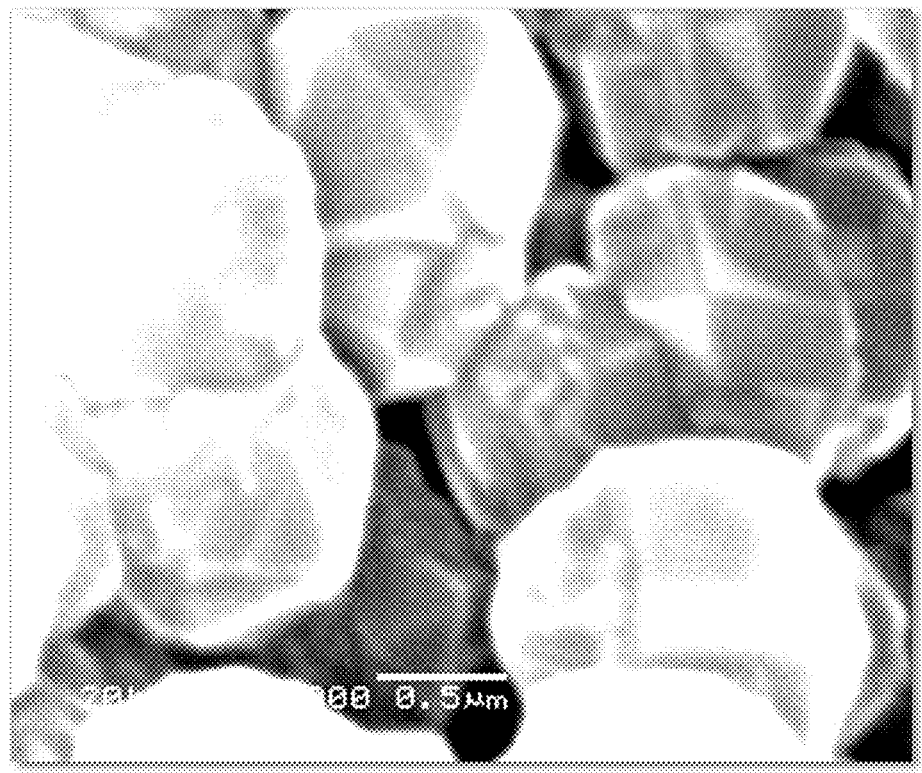
Figure 1D:
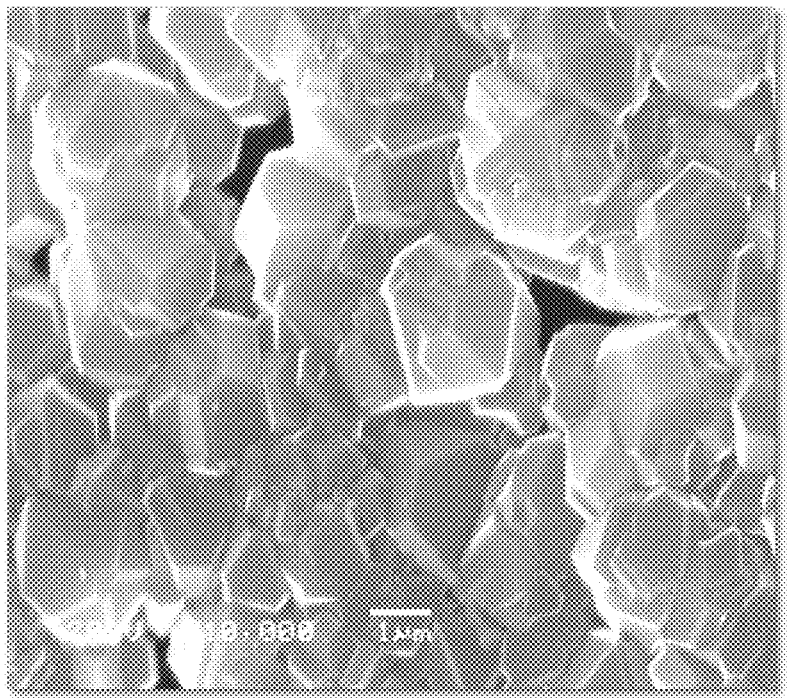
FIG. 1d shows an SEM image of microphase transition of food wrap polyethene to diamond on the Cu substrate, wherein the formation of dense microcrystalline diamond with crystallite size of 1.0-2.0 μm after 8 hours, according to an embodiment of the invention.

The study of the early stages of fabrication by scanning electron microscopy reveals the formation of diamond nanocrystallites as intermediates. During the first 1-3 hours the heated polyethene interacts with carbon radicals released from the input gases to produce numerous diamond sub-nanocrystalline centers acting as nucleation sites for diamond growth as seen on FIG. 1a. The so formed nucleation sites and the hydrogen environment in CVD chamber plays critical role for the fabrication of microcrystalline diamond over the next 3-6 hours as seen on FIGS. 1b and 1c. With passage of time the diamond film grows denser. The as-grown film after a total reaction time of 8 hours is shown in FIG. 1d. It shows the presence of microcrystalline diamonds of size 1.0-2.0 μm.

Figure 2:
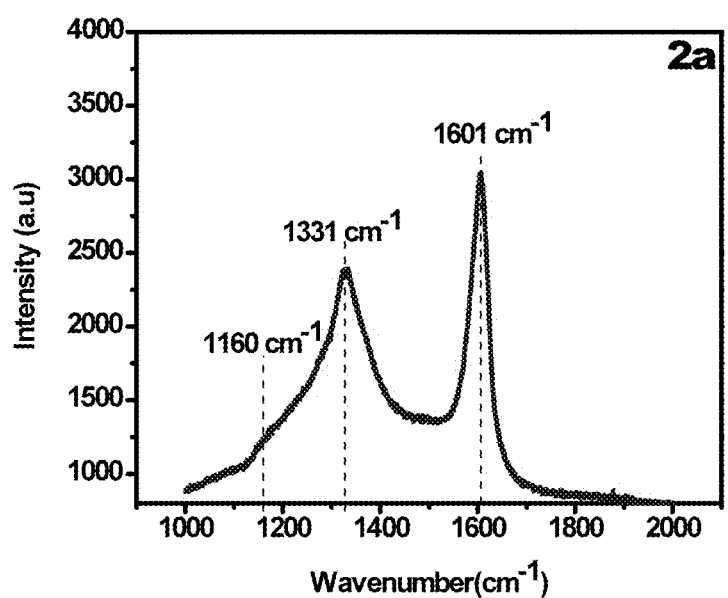
FIG. 2 shows Micro-Raman characterizations of the two stages of formation of diamond from food-wrap polyethene on the Cu substrate, according to an embodiment of the invention.
Figure 2:
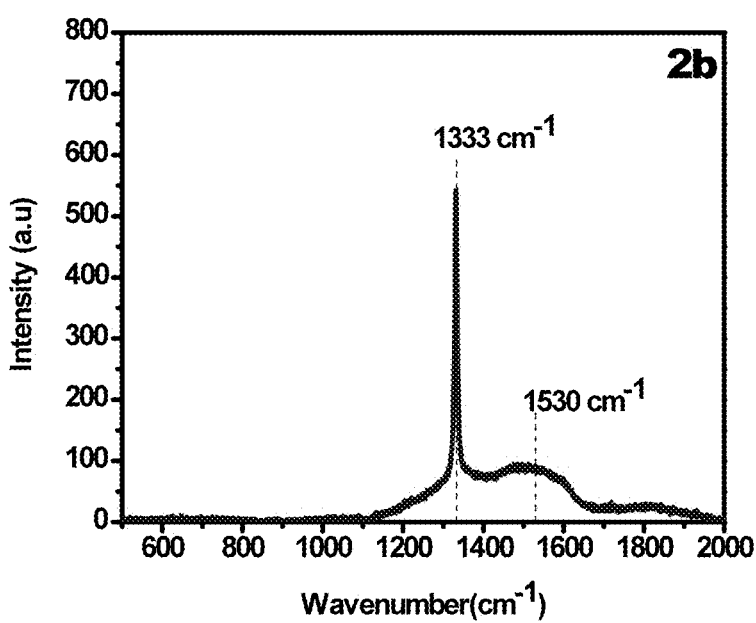

A substrate area of the order of 4 μm$^2$ was analyzed by micro-Raman spectroscopy as shown in FIG. 2. The Raman spectrum of the polyethene-coated copper substrate recorded after the first 1-3 hours is shown in plot 2a. It reveals the intermediate stage, exhibiting a shoulder around 1160-cm$^{-1}$ corresponding to nanocrystalline diamond and a broad peak around 1331 cm$^{-1}$ that is the signature of sp$^3$ bonded carbon. The peaks obtained confirm the presence of sub-nanocrystalline diamond that acts as nucleation centers for further diamond growth. A band in the 1580-1620 cm$^{-1}$ region corresponds to the graphite structure. Plot 2b shows the Raman spectrum of the diamond film obtained after the completion of the reaction and shows a sharp and intense peak at 1333 cm$^{-1}$ that is the signature of sp$^3$ bonded C in the diamond phase. The band located around 1530 cm$^{-1}$ is the so-called G-band that corresponds to the presence of sp$^2$ hybridized carbon atoms in the graphite structure. The coverage of the substrate surface was continuous in the present films, and also the graphite concentration was <5% as seen on plot 2b.

II. Nucleation and Fabrication of Diamond on Silver Substrate

Figure 3:
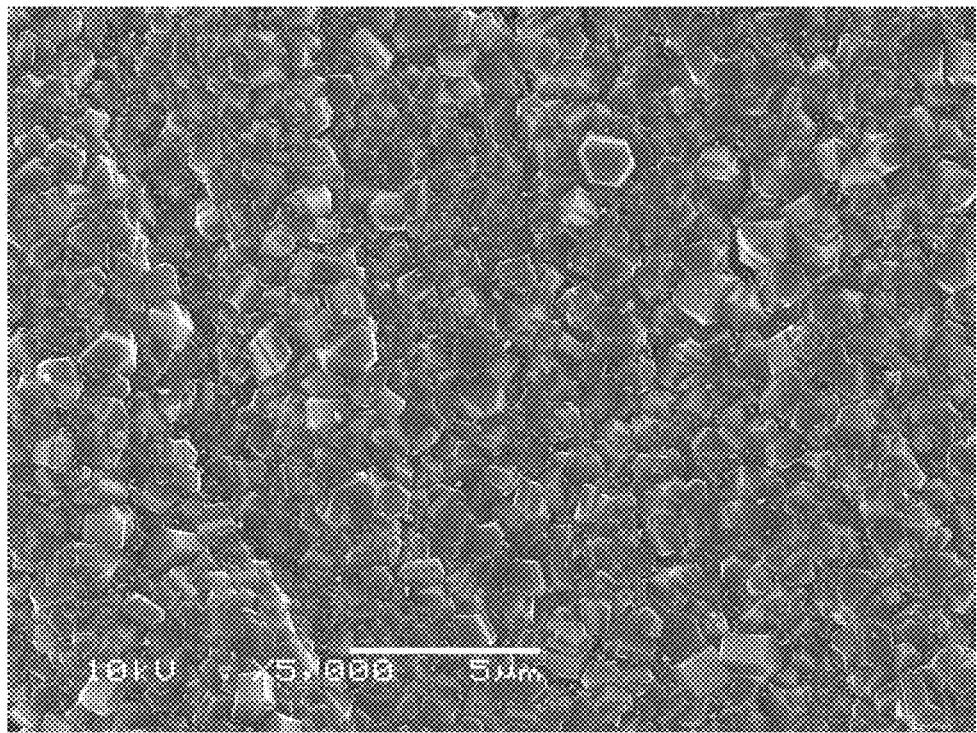
FIG. 3 shows an SEM image of the formation of dense microcrystalline diamond on the silver substrate after 8 hours, according to an embodiment of the invention.

A polyethene layer with a thickness of a 90 µm was melted on a silver substrate at a temperature of 120° C. The substrate was cleaned in isopropanol before introducing it into the HFCVD chamber. The gas mixture consisted of 0.3% methane in hydrogen at a constant pressure of 20 Torr and a total gas flow of 100 sccm. The gas mixture was activated by a filament of rhenium wire of 8 cm length and 0.5 mm diameter and positioned at 9 mm above the heated Mo disks (25 mm diameter) that were used as substrate holders. The substrate temperature was kept ~500° C. and the filament temperature was kept ~2500° C. The reaction was carried out for a period of 8 hrs. A highly uniform film of diamond was obtained. The as-grown film after the reaction is shown in FIG. 3. It shows the presence of microcrystalline diamonds of size 0.4-2.0 µm.

Figure 4:
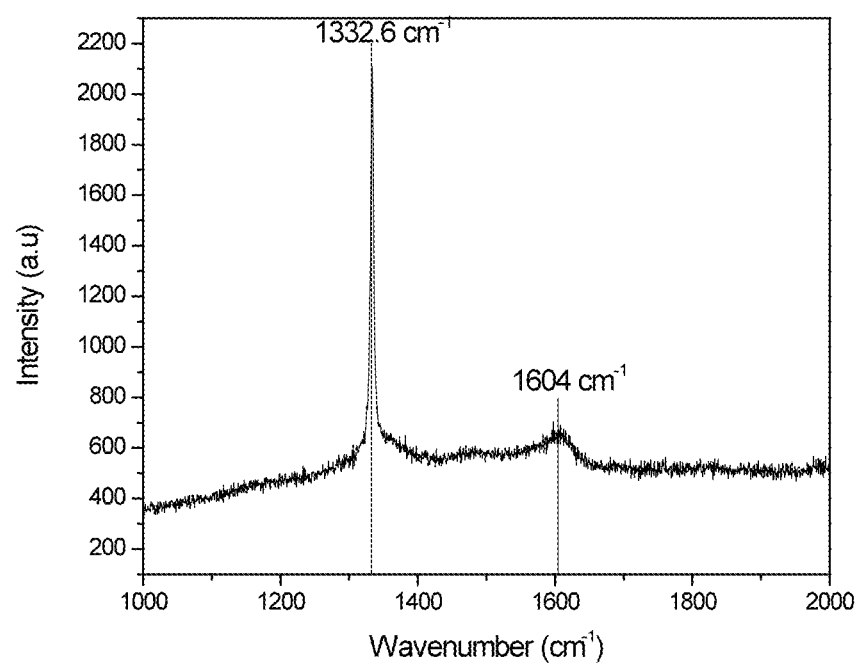
FIG. 4 shows Micro-Raman characterization of as-deposited microcrystalline diamond film on the silver substrate at the end of 8 hours, according to an embodiment of the invention.

A substrate area of the order of 4 µm$^2$ was analyzed by micro-Raman spectroscopy. The Raman spectrum of the polyethene-coated silver substrate is illustrated in FIG. 4 shows the Raman spectrum of the diamond film obtained after the completion of the reaction and shows a sharp and intense peak at 1332.6 cm$^{-1}$ that is the signature of sp$^3$ bonded C in the diamond phase. The band located around 1604 cm$^{-1}$ is the G-band that corresponds to the presence of sp$^2$ hybridized carbon atoms in the graphite structure. The coverage of the substrate surface was continuous in the present film.

Reference Example A

A 20 µm thick layer of a 10% solution of polyhydridocarbyne in isopropanol and 1 mg FeO along with nanodiamond powder was coated on a Mo substrate. The substrate was exposed to a varying ratio of reactive gas mixture of 1.0% methane in hydrogen at a constant pressure of 20 Torr and a total gas flow of 100 sccm in a chemical vapor deposition chamber. The gas mixture was activated by a filament of rhenium wire of 8 cm length and 0.5 mm diameter and positioned at 9 mm above the heated Mo disk (25 mm diameter) that was used as substrate holder. The substrate temperature was kept ~500° C. and the filament temperature was kept ~2500° C. The experimental conditions were varied by experimenting with different parameters. The reaction was carried out for even up to 20 hours, in the 500-900° C. temperature range at 0.3-2% methane concentration range, and a pressure range of 10-20 Torr. The thickness of the polycarbyne film was also varied from 20-100 µm, but no deposition of any kind of diamond was observed in any set of experimental parameters, even in the presence of nanodiamond powder which is an excellent seed for diamond fabrication or the use of biasing method which is another common technique employed for diamond seeding.

Reference Example B

Polyethene layers of varying thickness 50, 90, 180 and 270 µm were deposited on silicon substrates and subjected to same experimental conditions as those of working example I explained above for a period of 8 hrs. There was no diamond formation observed on the Si substrate even with increasing thickness of the polyethene layer and increasing time of reaction.

Reference Example C

Polyethene layers of varying thickness 50, 90, 180 and 270 µm were deposited on Molybdenum substrates and subjected to same experimental conditions as those of working example I explained above for a period of 8 hrs. There was no diamond formation observed on the Mo substrate even with increasing thickness of the polyethene layer and more reaction time.

Although the present invention has been described herein with reference to the foregoing exemplary embodiment, this embodiment does not serve to limit the scope of the present invention. Accordingly, those skilled in the art to which the present invention pertains will appreciate that various modifications are possible, without departing from the technical spirit of the present invention.

We claim:

1. A method of fabricating diamond using polyethene as nucleating agent, said method comprising:
   providing a substrate surface;
   depositing a polyethene layer on said substrate surface; and
   exposing said polyethene-deposited substrate surface to a gaseous mixture comprising of: at least a carbon-containing gas and hydrogen, in presence of an energy source that breaks the gaseous molecules into radicals, said substrate surface is a metal that neither forms carbide nor dissolves carbon.

2. The method of claim 1, wherein said metal comprises one of: Cu, Ag, and Au.

3. The method of claim 1 wherein said carbon-containing gas is selected from the group consisting of: hydrocarbons, hydrocarbons containing oxygen, hydrocarbons containing nitrogen, hydrocarbons containing halogens, carbon vapor, CO and $CO_2$.

4. The method of claim 1, wherein said polyethene is deposited on said substrate surface by one of: melting, sputtering, spin coating, dipping, and dip pen lithography.

5. The method of claim 1, wherein the polyethene layer is at least about 90 nm thick.

6. The method of claim 1, wherein the ratio of the carbon-containing gas and hydrogen is about 0.1-3.0:100.

7. The method of claim 1, wherein the total pressure of the gases is in the range of from about 10 Torr to about 100 Torr.

8. The method of claim 1, wherein said polyethene-deposited substrate surface is exposed to said gaseous mixture at a substrate temperature of from about 400° C. to about 800° C.

9. The method of claim 1, wherein said polyethene comprises one of: low density polyethene (LDPE), medium density polyethene (MDPE), high density polyethene (HDPE), linear low density polyethene (LLDPE) and very low density polyethene (VLDPE).

10. The method of claim 1, wherein said polyethene has a density from about 0.80 g/cm$^3$ to about 0.95 g/cm$^3$.

11. The method of claim 1, further comprising enhancing the density of diamond nucleation and growth rate by adding to said gaseous mixture a sulfur-containing species.

12. The method of claim 11, wherein said sulfur-containing species is added to said gaseous mixture in a concentration range of from about 100 ppm to about 1000 ppm.

13. The method of claim 1, wherein said polyethene-deposited substrate surface is exposed to said gaseous mixture for a period of at least 0.5 hours.

* * * * *